(12) United States Patent
Kim et al.

(10) Patent No.: US 12,543,443 B2
(45) Date of Patent: Feb. 3, 2026

(54) DISPLAY DEVICE

(71) Applicant: Samsung Display Co., Ltd., Yongin-si (KR)

(72) Inventors: Jungi Kim, Hwaseong-si (KR); Jeong Won Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 523 days.

(21) Appl. No.: 17/740,764

(22) Filed: May 10, 2022

(65) Prior Publication Data

US 2023/0115645 A1 Apr. 13, 2023

(30) Foreign Application Priority Data

Oct. 7, 2021 (KR) .................. 10-2021-0132950

(51) Int. Cl.
*H10K 59/80* (2023.01)
*H10K 59/122* (2023.01)
*H10K 50/11* (2023.01)

(52) U.S. Cl.
CPC ..... *H10K 59/122* (2023.02); *H10K 59/80521* (2023.02); *H10K 50/11* (2023.02)

(58) Field of Classification Search
CPC .............. H10K 59/122; H10K 50/822; H10K 59/80521; H10K 50/11; H10K 59/12; H10K 59/121; H10K 59/353; H10K 59/00
See application file for complete search history.

(56) References Cited

U.S. PATENT DOCUMENTS

| | | | |
|---|---|---|---|
| 2002/0127478 A1* | 9/2002 | Weaver | C23C 14/042 430/323 |
| 2012/0205678 A1* | 8/2012 | Ikeda | H10K 50/805 438/22 |
| 2012/0217516 A1 | 8/2012 | Hatano et al. | |
| 2013/0248867 A1* | 9/2013 | Kim | H10K 59/873 438/34 |
| 2016/0372670 A1* | 12/2016 | Min | H10K 71/135 |
| 2018/0190731 A1 | 7/2018 | Park et al. | |
| 2018/0294322 A1* | 10/2018 | Han | H10K 59/126 |
| 2019/0006443 A1* | 1/2019 | Hanashima | H10K 71/60 |
| 2020/0235172 A1 | 7/2020 | Lee et al. | |
| 2021/0343989 A1* | 11/2021 | Imabayashi | H05B 33/22 |
| 2024/0055457 A1* | 2/2024 | Okazaki | G01S 17/08 |
| 2024/0121990 A1* | 4/2024 | Yamazaki | H05B 33/12 |

FOREIGN PATENT DOCUMENTS

| | | |
|---|---|---|
| JP | 2012190794 A | 10/2012 |
| KR | 1020170042415 A | 4/2017 |
| KR | 1020180079059 A | 7/2018 |
| KR | 102004305 B1 | 7/2019 |
| KR | 1020200091059 A | 7/2020 |
| KR | 102155815 B1 | 9/2020 |

* cited by examiner

*Primary Examiner* — Matthew C Landau
*Assistant Examiner* — David W Ward
(74) *Attorney, Agent, or Firm* — CANTOR COLBURN LLP

(57) ABSTRACT

A display device includes a light emitting part disposed on a substrate, where the light emitting part includes a common layer, and a separator disposed on the substrate to surround the light emitting part on a plane, where a length of an upper portion of the separator is greater than a length of a lower portion of the separator in a cross-section, and an open portion is defined in the separator.

19 Claims, 11 Drawing Sheets

DISPLAY DEVICE

This application claims priority to Korean Patent Application No. 10-2021-0132950, filed on Oct. 7, 2021, and all the benefits accruing therefrom under 35 U.S.C. § 119, the content of which in its entirety is herein incorporated by reference.

BACKGROUND

1. Field

Implementations of the inventive concept relate generally to a display device.

2. Description of the Related Art

A display device is a device that displays an image, and examples of the display device are an organic light emitting display device, a liquid crystal display device, and the like. The organic light emitting display includes an organic light emitting layer interposed between a pixel electrode and a common electrode. When the two electrodes inject electrons and holes into the organic light emitting layer, respectively, light is emitted according to a combination of electrons and holes.

The organic light emitting display includes red, green, and blue sub-pixels, and an organic light emitting layer for emitting light of a predetermined color is formed in each sub-pixel. In addition, at least one common layer (e.g., a hole transport layer, an electron transport layer, etc.) is further formed on and/or under the organic light emitting layer to improve a luminous efficiency of the organic light emitting layer.

SUMMARY

In a display device including an organic light emitting layer where at least one common layer is further formed on and/or under the organic light emitting layer to improve a luminous efficiency, the common layer may be continuously deposited on each of the sub-pixels compensate for disadvantages of a shadow mask (e.g., reduced yield, etc.). However, in such a display device, undesired leakage of current to the side through the continuous common layer may occur.

Embodiments provide a display device in which leakage of current to a side through a continuous common layer on and/or under an organic light emitting layer is effectively prevented.

An embodiment of a display device includes a light emitting part disposed on a substrate, where the light emitting part includes a common layer, and a separator disposed on the substrate to surround the light emitting part on a plane, where a length of an upper portion of the separator is greater than a length of a lower portion of the separator in a cross-section, and an open portion is defined in the separator.

In an embodiment, the separator may be positioned to surround the light emitting part along a shape of the light emitting part on the plane.

In an embodiment, the light emitting part may have a quadrangular shape on the plane, and the separator may be positioned to surround the light emitting part in a spiral shape on the plane.

In an embodiment, the light emitting part may have a rhombus shape on the plane, and the separator may be positioned to surround the light emitting part in a spiral shape on the plane.

In an embodiment, the light emitting part may have a triangular shape on the plane, and the separator may be positioned to surround the light emitting part in a spiral shape on the plane.

In an embodiment, the light emitting part may have a circular shape on the plane, and the separator may be positioned to surround the light emitting part in a spiral shape on the plane.

In an embodiment, the common layer may be disposed on the separator, and the common layer may be cut off by the separator.

In an embodiment, the separator may include an organic material.

In an embodiment, the separator may include a metal material.

In an embodiment, the separator may have an inverted trapezoidal shape in the cross-section, and an obtuse angle of the inverted trapezoidal shape may be greater than 100 degrees.

In an embodiment, the display device may further include an encapsulation layer disposed on the light emitting part and the separator to cover the light emitting part and the separator.

In an embodiment, the light emitting part may include a first light emitting layer which emits light of a predetermined color and a second light emitting layer disposed on the first light emitting layer, where the second light emitting layer may emit light of a same color as the predetermined color of the first light emitting layer.

In an embodiment, the common layer may include a first common layer disposed under the first light emitting layer.

In an embodiment, the first common layer may include a first hole transport layer.

In an embodiment, the common layer may further include a second common layer disposed between the first light emitting layer and the second light emitting layer.

In an embodiment, the second common layer may include a charge generation layer.

In an embodiment, the second common layer may further include a first electron transport layer disposed under the charge generation layer and a second hole transport layer disposed on the charge generation layer.

In an embodiment, the common layer may further include a third common layer disposed on the second light emitting layer.

In an embodiment, the third common layer may include a second electron transport layer.

In embodiments of the invention, a display device may include a light emitting part and a separator. In such embodiments, the separator may be positioned to surround the light emitting part on a plane. Accordingly, the separator may cut off adjacent light emitting parts from each other, such that the separator may prevent a current applied to the light emitting part from leaking to other adjacent light emitting parts.

BRIEF DESCRIPTION OF DRAWINGS

The accompanying drawings, which are included to provide a further understanding of the inventive concept and are incorporated in and constitute a part of this specification, illustrate embodiments of the inventive concept together with the description.

DETAILED DESCRIPTION

Figure 1:
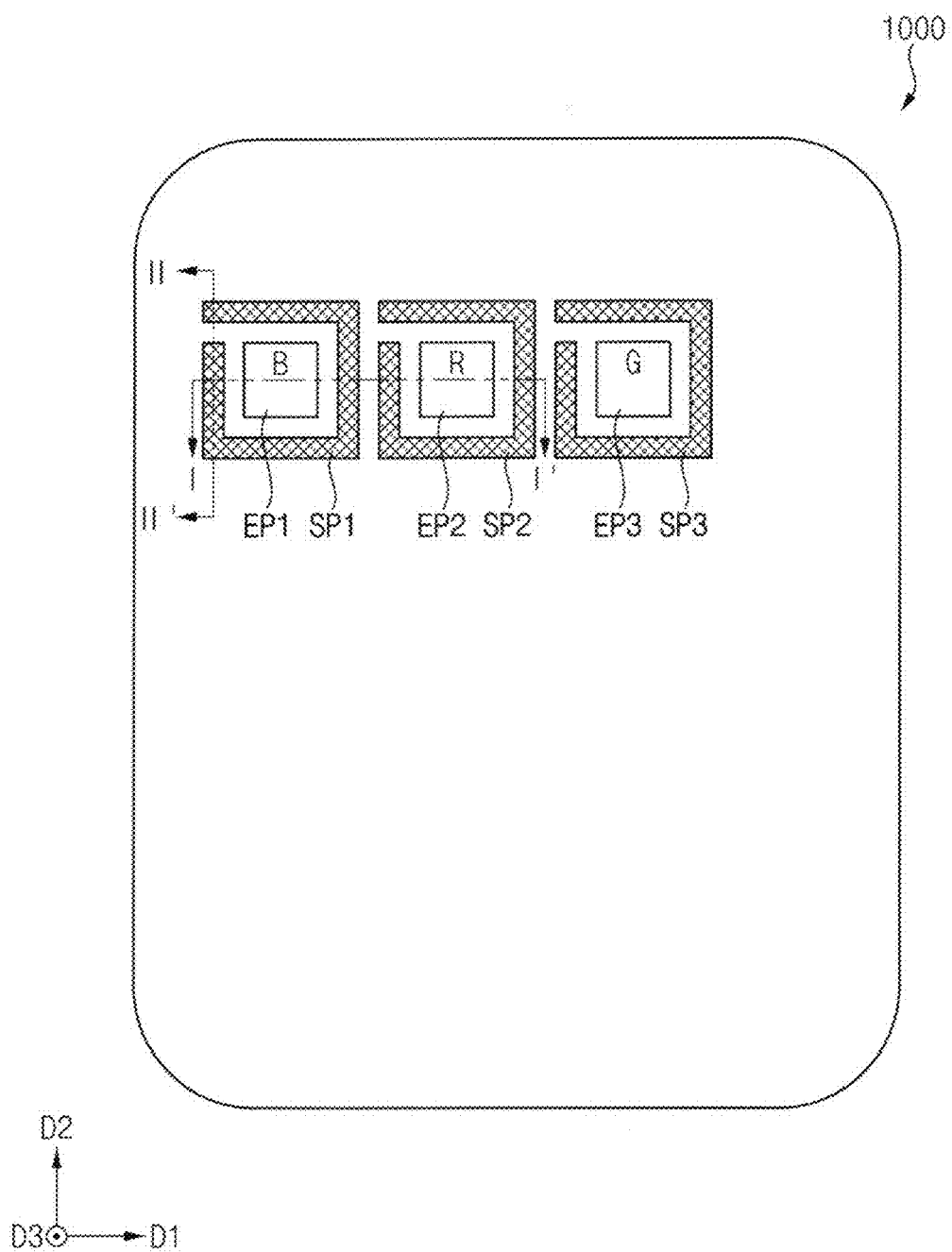
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Embodiments of the invention will hereinafter be described in detail with reference to the accompanying drawings.

FIG. 1 is a plan view illustrating a display device according to an embodiment.

Referring to FIG. 1, an embodiment of a display device 1000 may include at least one light emitting part and at least one separator. In an embodiment, for example, as shown in FIG. 1, the display device 1000 may include a first light emitting part EP1, a second light emitting part EP2, a third light emitting part EP3, a first separator SP1, a second separator SP2, and a third separator SP3.

In an embodiment, each of the first to third light emitting parts EP1, EP2, and EP3 may emit light of a predetermined color. In an embodiment, for example, the first light emitting part EP1 may emit blue light, the second light emitting part EP2 may emit red light, and the third light emitting part EP3 may emit green light.

Figure 3:
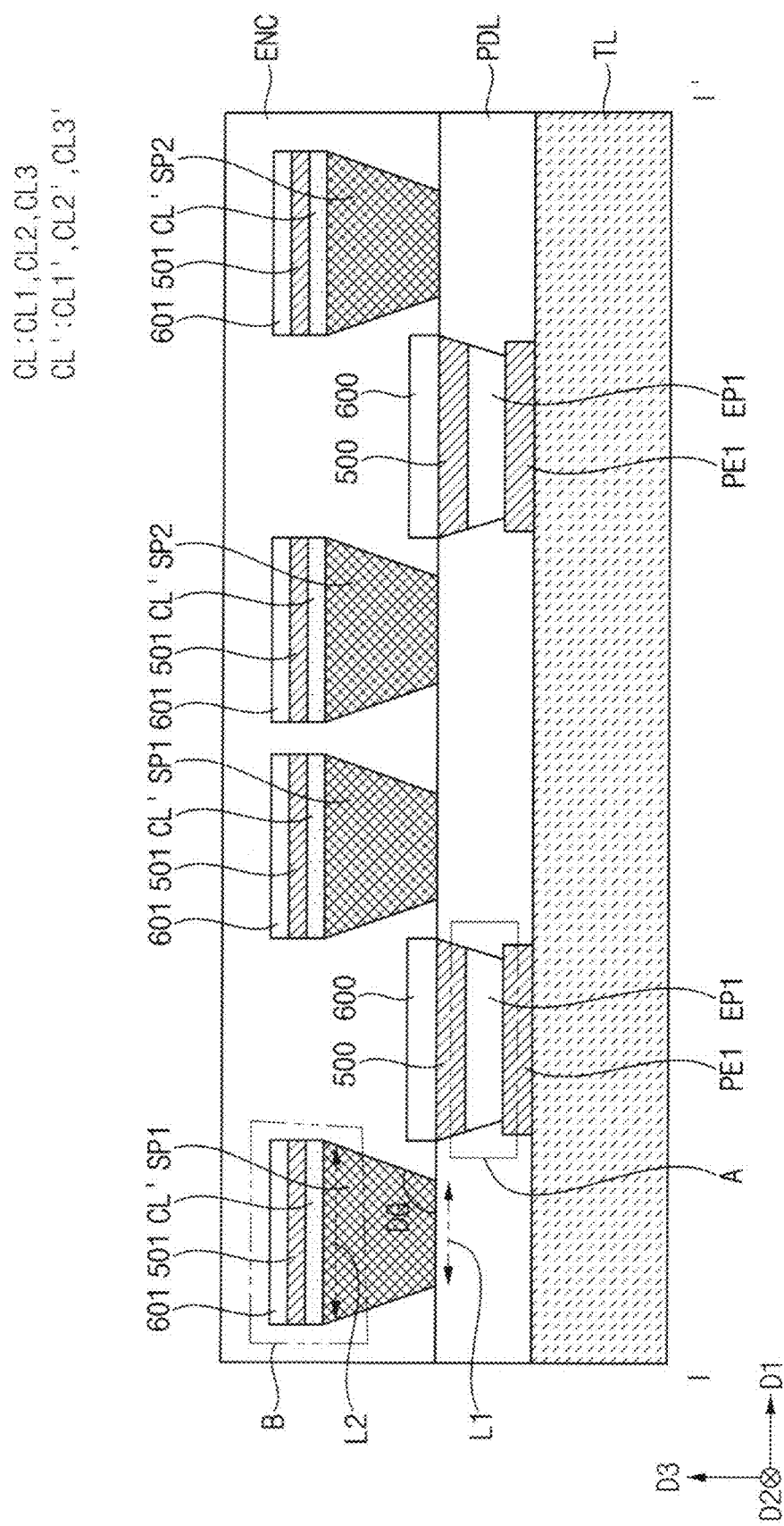
FIG. 3 is a cross-sectional view taken along line I-I' of FIG. 1.

In an embodiment, each of the first to third light emitting parts EP1, EP2, and EP3 may include at least one common layer (e.g., a common layer CL of FIG. 3). The common layer CL may be integrally formed as a single unitary unit on an entire surface of the display device 1000. In other words, the common layer included in the first light emitting part EP1, the common layer included in the second light emitting part EP2, and the common layer included in the third light emitting part EP3 may be formed together. In an embodiment, for example, the common layer CL may be deposited using an open mask.

In an embodiment, each of the first to third light emitting parts EP1, EP2, and EP3 may have a predetermined shape. In an embodiment, for example, as shown in FIG. 1, each of the first to third light emitting parts EP1, EP2, and EP3 may have a quadrangular shape. However, the invention is not limited thereto. In an embodiment, for example, each of the first to third light emitting parts EP1, EP2, and EP3 may have a diamond shape, a triangular shape, a circular shape, or the like. In addition, each of the first to third light emitting parts EP1, EP2, and EP3 may have a different shape from each other.

In an embodiment, the first to third light emitting parts EP1, EP2, and EP3 may be arranged along a first direction D1 crossing a second direction D2. Here, a third direction D3 may be a direction perpendicular to the first direction D1 and the second direction D2 or a thickness direction of the display device 1000. However, an arrangement structure of the first to third light emitting parts EP1, EP2, and EP3 is not limited thereto. For example, the first to third light emitting parts EP1, EP2, and EP3 may be arranged in a triangular shape, or may be arranged in a diamond shape.

The first to third separator SP1, SP2, and SP3 may cut off the first to third light emitting parts EP1, EP2, and EP3 from each other. In such an embodiment, the first to third separators SP1, SP2, and SP3 may cut off or block the common layer CL. Accordingly, the first to third separator SP1, SP2, and SP3 may prevent current from leaking through the first to third light emitting parts EP1, EP2, and EP3. The first separator layer SP1 may cut off between the first light emitting part EP1 and the second light emitting part EP2 so that the current applied to the first light emitting part EP1 does not leak to the second light emitting part EP2.

In an embodiment, the first to third separator SP1, SP2, and SP3 may be disposed or positioned to surround the first to third light emitting parts EP1, EP2, and EP3, respectively. In such an embodiment, the first separator SP1 may be positioned to surround the first light emitting part EP1 along the shape of the first light emitting part EP1. The second separator SP2 may be positioned to surround the second light emitting part EP2 along the shape of the second light emitting part EP2. The third separator SP3 may be positioned to surround the third light emitting part EP3 along the shape of the third light emitting part EP3.

In an embodiment, an open portion (e.g., an open portion OP of FIG. 6) may be defined in each of the first to third separators SP1, SP2, and SP3. The common layer CL may be integrally connected through the open portion OP.

Figure 2:
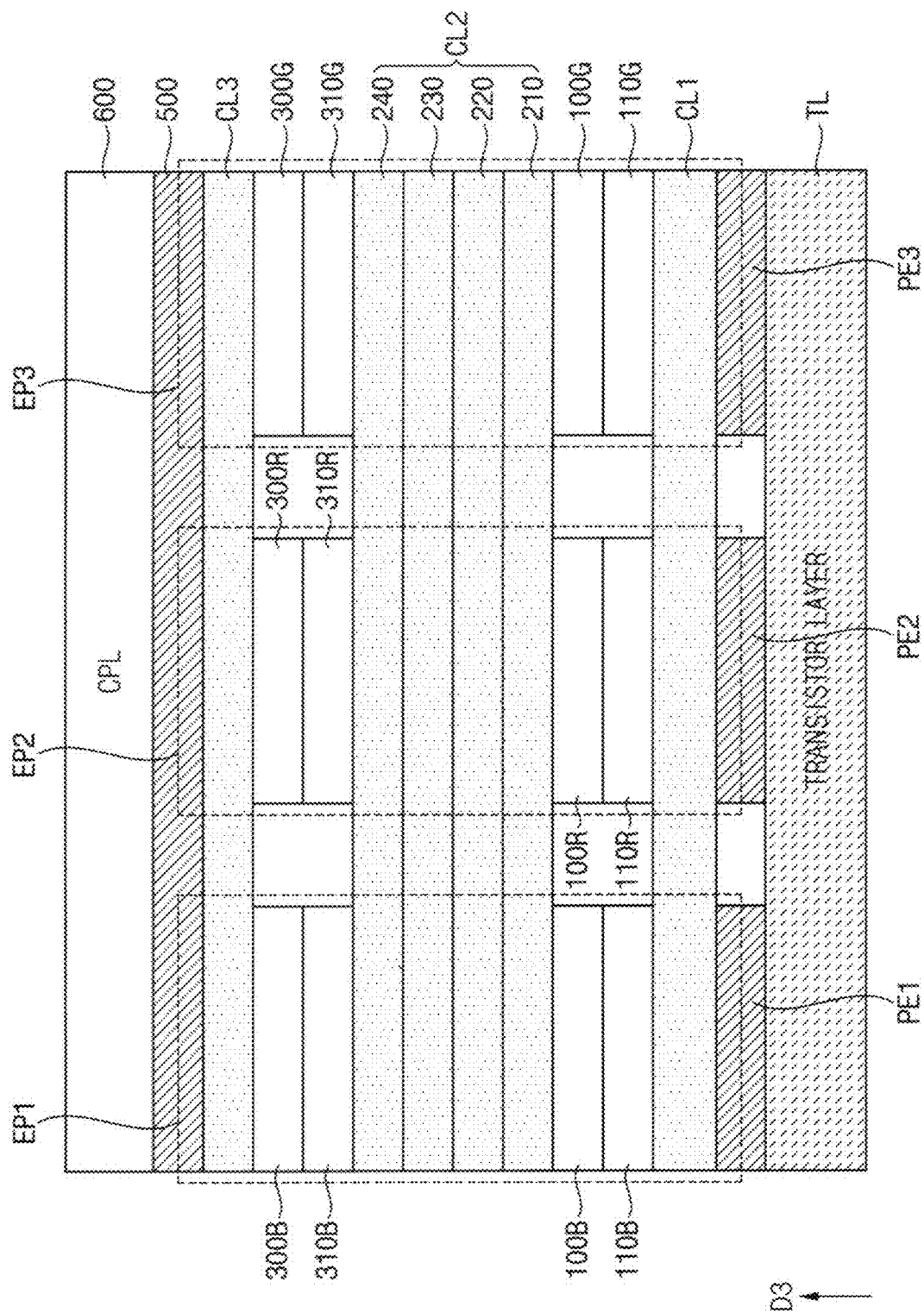
FIG. 2 is a cross-sectional view illustrating the display device of FIG. 1.

FIG. 2 is a cross-sectional view illustrating the display device of FIG. 1.

Referring to FIG. 2, an embodiment of the display device 1000 may include a transistor layer TL, a first pixel electrode PE1, a second pixel electrode PE2, a third pixel electrode PE3, the first light emitting part EP1, the second light emitting part EP2, the third light emitting part EP3, a common electrode 500, and a capping layer 600.

In an embodiment, the first light emitting part EP1 may include a first common layer CL1, a first blue auxiliary layer 110B, a first blue light emitting layer 100B, a second common layer CL2, a second blue color auxiliary layer 310B, a second blue light emitting layer 300B, and a third common layer CL3. The first common layer CL1 may include a first hole transport layer. The second common layer CL2 may include a first electron transport layer 210, a first charge generation layer 220, a second charge generation layer 230, and a second hole transport layer 240. The third common layer CL3 may include a second electron transport layer.

In an embodiment, the second light emitting part EP2 may include the first common layer CL1, a first red auxiliary layer 110R, a first red light emitting layer 100R, the second common layer CL2, a second red auxiliary layer 310R, a second red light emitting layer 300R, and the third common layer CL3.

In an embodiment, the third light emitting part EP3 may include the first common layer CL1, a first green auxiliary layer 110G, a first green light emitting layer 100G, the second common layer CL2, a second green auxiliary layer 310G, a second green light emitting layer 300G, and the third common layer CL3.

The first pixel electrode PE1 may be disposed on the transistor layer TL. In an embodiment, the first pixel electrode PE1 may be electrically connected to the transistor layer TL. The first pixel electrode PE1 may include or be formed of a metal, an alloy, a metal oxide, a reflective conductive material, or the like. In an embodiment, for example, the first pixel electrode PE1 may include at least one selected from silver (Ag), an alloy containing silver, molybdenum (Mo), an alloy containing molybdenum, aluminum (A"), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), and the like. These may be used alone or in combination with each other.

The second pixel electrode PE2 and the third pixel electrode PE3 may be disposed on the transistor layer TL. In an embodiment, the first to third pixel electrodes PE1, PE2, and PE3 may be formed together or during a same process. In addition, the first to third pixel electrodes PE1, PE2, and PE3 may be electrically disconnected from each other.

The first light emitting part EP1 may be disposed between the first pixel electrode PE1 and the common electrode 500. The second light emitting part EP2 may be disposed between the second pixel electrode PE2 and the common electrode 500. The third light emitting part EP3 may be disposed between the third pixel electrode PE3 and the common electrode 500.

The first common layer CL1 may be disposed on the first to third pixel electrodes PE1, PE2, and PE3. In an embodiment, as described above, the first common layer CL1 may be integrally formed as a single unitary unit on the first to third pixel electrodes PE1, PE2, and PE3. In such an embodiment, the first common layer CL1 may overlap the first to third pixel electrodes PE1, PE2, and PE3.

The first common layer CL1 may increase a hole mobility. In an embodiment, the first common layer CL1 may include a hole transport material. In an embodiment, for example, the first common layer CL1 may include at least one selected from 1,4,5,8,9,11-hexaazatriphenylene-hexanitrile ("HATCN"), cupper phthalocyanine ("CuPc"), poly(3,4)-ethylenedioxythiophene ("PEDOT"), polyaniline ("PANT"), and N,N-dinaphthyl-N,N'-diphenylbenzidine ("NPD"). These may be used alone or in combination with each other.

The first blue auxiliary layer 110B may be disposed on the first common layer CL1 and may overlap the first pixel electrode PE1. The first blue auxiliary layer 110B may reinforce a resonance of the light emitted from the first blue light emitting layer 100B. In an embodiment, the first blue auxiliary layer 110B may include or be formed of an amine-based organic compound, and the resonance may be reinforced by adjusting the thickness of the first blue auxiliary layer 110B. In an alternative embodiment, the first blue auxiliary layer 110B may include a metal having a high reflectance, such as Ag or MgAg, and a material for adjusting an optical path, such as SiN, SiO2, TiO2, Ta2O5, ITO, or IZO.

The first red auxiliary layer 110R may be disposed on the first common layer CL1 and may overlap the second pixel electrode PE2. The first red auxiliary layer 110R may reinforce a resonance of the light emitted from the first red light emitting layer 100R.

The first green auxiliary layer 110G may be disposed on the first common layer CL1 and may overlap the third pixel electrode PE3. The first green auxiliary layer 110G may reinforce a resonance of the light emitted from the first green light emitting layer 100G.

The first blue light emitting layer 100B may be disposed on the first blue auxiliary layer 110B, and may overlap the first pixel electrode PE1. When electrons and holes are injected into the first blue light emitting layer 100B, the first blue light emitting layer 100B may emit light of a predetermined color. In an embodiment, for example, the first blue light emitting layer 100B may include or be formed of an organic material that emits blue light, and may emit blue light.

The first red light emitting layer 100R may be disposed on the first red auxiliary layer 110R, and may overlap the second pixel electrode PE2. When electrons and holes are injected into the first red light emitting layer 100R, the first red light emitting layer 100R may emit light of a predetermined color. In an embodiment, for example, the first red light emitting layer 100R may include or be formed of an organic material that emits red light, and may emit red light.

The first green light emitting layer 100G may be disposed on the first green auxiliary layer 110G, and may overlap the third pixel electrode PE3. When electrons and holes are injected into the first green light emitting layer 100G, the first green light emitting layer 100G may emit light of a predetermined color. In an embodiment, for example, the first green light emitting layer 100G may include or be formed of an organic material that emits green light, and may emit green light.

The first electron transport layer 210 may be disposed on the first blue light emitting layer 100B, the first red light emitting layer 100R, and the first green light emitting layer 100G. In an embodiment, the first electron transport layer 210 may be integrally formed as a single unitary unit on the first blue light emitting layer 100B, the first red light emitting layer 100R, and the first green light emitting layer 100G. In such an embodiment, the first electron transport layer 210 may overlap the first to third pixel electrodes PE1, PE2, and PE3.

The first electron transport layer 210 may increase electron mobility. In an embodiment, the first electron transport layer 210 may include an electron transport material. In an embodiment, for example, the first electron transport layer 210 may include at least one selected from 8-Hydroxyquinolato-lithium ("LiQ"), tris(8-hydroxyquinolino)aluminum ("Alq3"), 2-(4-biphenylyl)-5-(4)-tert-butylpheny)-1,3, 4oxadiazole ("PBD"), 1,2,4-triazol e derivative ("TAZ"), spiro-PBD, and the like. These may be used alone or in combination with each other.

The first charge generation layer 220 may be disposed on the first electron transport layer 210. In an embodiment, the first charge generation layer 220 may be integrally formed as a single unitary unit on the first electron transport layer 210. In such an embodiment, the first charge generation layer 220 may overlap the first to third pixel electrodes PE1, PE2, and The first charge generation layer 220 may supply electrons to the first blue light emitting layer 100B, the first red light emitting layer 100R, and the first green light emitting layer 100G. In an embodiment, for example, the first charge generation layer 220 may include at least one selected from a metal, an alloy, a metal oxide, a reflective conductive material, an organic material doped with an n-type material, and the like.

The second charge generation layer 230 may be disposed on the first charge generation layer 220. In an embodiment, the second charge generation layer 230 may be integrally formed as a single unitary unit on the first charge generation layer 220. In such an embodiment, the second charge generation layer 230 may overlap the first to third pixel electrodes PE1, PE2, and PE3.

The second charge generation layer 230 may supply holes to the second blue light emitting layer 300B, the second red light emitting layer 300R, and the second green light emitting layer 300G. In an embodiment, for example, the second charge generation layer 230 may include at least one selected from a metal, an alloy, a metal oxide, a reflective conductive material, and an organic material doped with a p-type material.

The first and second charge generation layers 220 and 230 may have an NP junction structure and may be disposed between the light emitting layers. The first and second charge generation layers 220 and 230 may balance charges between the light emitting layers.

The second hole transport layer 240 may be disposed on the second charge generation layer 230. In an embodiment, the second hole transport layer 240 may be integrally formed as a single unitary unit on the second charge generation layer 230. In such an embodiment, the second hole transport layer 240 may overlap the first to third pixel electrodes PE1, PE2, and PE3.

The second hole transport layer 240 may increase a hole mobility. In an embodiment, the second hole transport layer 240 may include a hole transport material. In an embodiment, for example, the second hole transport layer 240 may include at least one selected from HATCN, CuPc, PEDOT, PANI, and NPD. These may be used alone or in combination with each other.

The second blue auxiliary layer 310B may be disposed on the second hole transport layer 240, and may overlap the first pixel electrode PE1. The second blue auxiliary layer 310B may reinforce a resonance of the light emitted from the second blue light emitting layer 300B. In an embodiment, the second blue auxiliary layer 310B may include or be formed of an amine-based organic compound, and the resonance may be reinforced by adjusting the thickness of the second blue auxiliary layer 310B. In an alternative embodiment, the second blue auxiliary layer 310B may include a metal having high reflectivity, such as Ag or MgAg, and a material for adjusting an optical path, such as SiN, SiO2, TiO2, Ta2O5, ITO, or IZO.

The second red auxiliary layer 310R may be disposed on the second hole transport layer 240, and may overlap the second pixel electrode PE2. The second red auxiliary layer 310R may reinforce a resonance of the light emitted from the second red light emitting layer 300R.

The second green auxiliary layer 310G may be disposed on the second hole transport layer 240, and may overlap the third pixel electrode PE3. The second green auxiliary layer 310G may reinforce a resonance of light emitted from the second green light emitting layer 300G.

The second blue light emitting layer 300B may be disposed on the second blue auxiliary layer 310B, and may overlap the first pixel electrode PE1. When electrons and holes are injected into the second blue light emitting layer 300B, the second blue light emitting layer 300B may emit light of a predetermined color. In an embodiment, for example, the second blue light emitting layer 300B may include or be formed of an organic material that emits blue light. Accordingly, the second blue light emitting layer 300B may emit light of a same blue color as that of the light emitted from the first blue light emitting layer 100B.

The second red light emitting layer 300R may be disposed on the second red auxiliary layer 310R, and may overlap the second pixel electrode PE2. When electrons and holes are injected into the second red light emitting layer 300R, the second red light emitting layer 300R may emit light of a predetermined color. In an embodiment, for example, the second red light emitting layer 300R may include or be formed of an organic material that emits red light. Accordingly, the second red light emitting layer 300R may emit light of a same red color as that of the light emitted from the first red light emitting layer 100R.

The second green light emitting layer 300G may be disposed on the second green auxiliary layer 310G, and may overlap the third pixel electrode PE3. When electrons and holes are injected into the second green light emitting layer 300G, the second green light emitting layer 300G may emit light of a predetermined color. In an embodiment, for example, the second green light emitting layer 300G may include or be formed of an organic material that emits green light. Accordingly, the second green light emitting layer 300G may emit light of a same green color as that of the light emitted from the first green light emitting layer 100G.

The third common layer CL3 may be disposed on the second blue light emitting layer 300B, the second red light emitting layer 300R, and the second green light emitting layer 300G. In an embodiment, the third common layer CL3 may be integrally formed as a single unitary unit on the second blue light emitting layer 300B, the second red light emitting layer 300R, and the second green light emitting layer 300G. In such an embodiment, the third common layer CL3 may overlap the first to third pixel electrodes PE1, PE2, and PE3.

The third common layer CL3 may increase electron mobility. In an embodiment, the third common layer CL3 may include an electron transport material. In an embodiment, for example, the third common layer CL3 may include at least one selected from LiQ, Alq3, PBD, TAZ, Spiro-PBD, and the like. These may be used alone or in combination with each other.

The common electrode 500 may be disposed on the third common layer CL3. In an embodiment, the common electrode 500 may be integrally formed as a single unitary unit on the third common layer CL3. In such an embodiment, the common electrode 500 may overlap the first to third pixel electrodes PE1, PE2, and PE3.

In an embodiment, the common electrode 500 may include a metal, an alloy, a metal oxide, a reflective conductive material, or the like. In an embodiment, for example, the common electrode 500 may include at least one selected from silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), magnesium (Mg), ytterbium (Yb), nickel (Ni), chromium (Cr), chromium nitride (CrN), titanium (Ti), tantalum (Ta), platinum (Pt), scandium (Sc), ITO, IZO, and the like. These may be used alone or in combination with each other.

The capping layer (CPL in FIG. 2) 600 may be disposed on the common electrode 500. In an embodiment, the capping layer 600 may be integrally formed as a single unitary unit on the common electrode 500. In such an embodiment, the capping layer 600 may overlap the first to third pixel electrodes PE1, PE2, and PE3.

In such an embodiment, the light emitted from the first to third light emitting parts EP1, EP2, and EP3 may be resonated due to the refractive index of the capping layer 600, and the light extraction efficiencies of the first to third light emitting parts EP1, EP2, and EP3 may be improved. In an embodiment, for example, the capping layer 600 may include an organic material.

As described above, in an embodiment, each of the first to third light emitting parts EP1, EP2, and EP3 may have a two-stack structure in which light emitting layers are stacked. However, the invention is not limited thereto. In an alternative embodiment, each of the first to third light emitting parts EP1, EP2, and EP3 may have a one-stack structure in which a single light emitting layer is provided or formed. In another alternative embodiment, the first light emitting part EP1 may have the two-stack structure, and each of the second and third light emitting parts EP2 and EP3 may have the one-stack structure.

Figure 4:
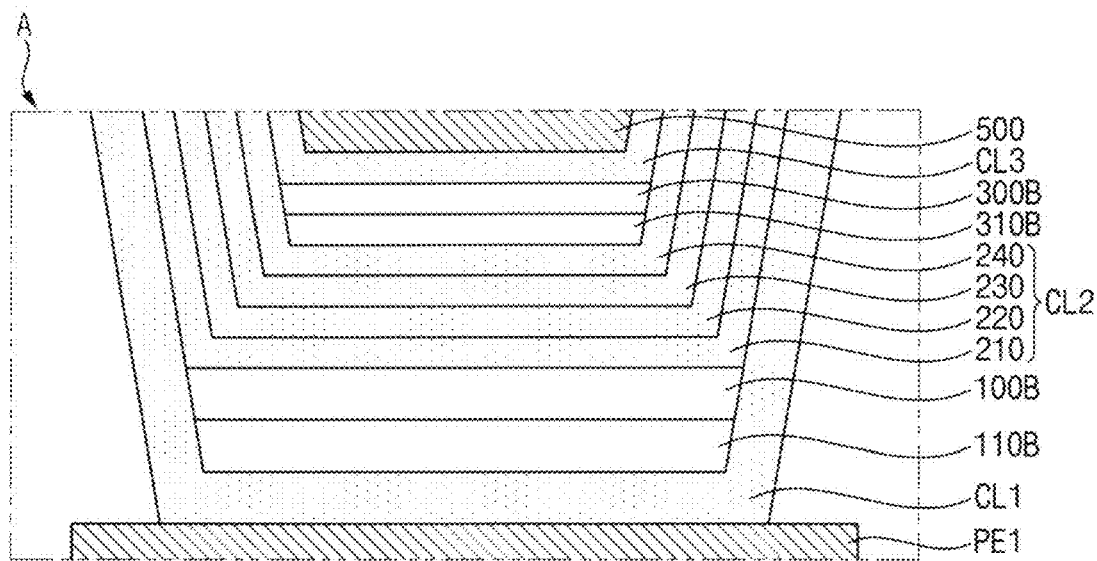
FIG. 4 is an enlarged view of A of FIG. 3.
Figure 5:
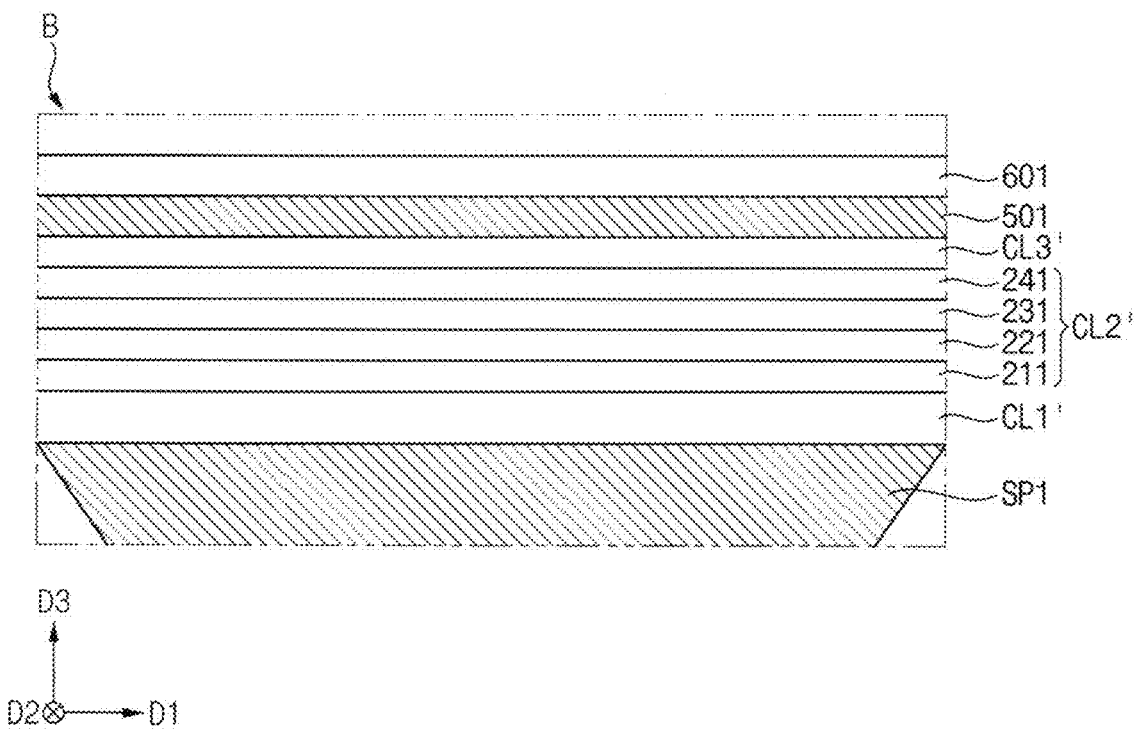
FIG. 5 is an enlarged view of B of FIG. 3.

FIG. 3 is a cross-sectional view taken along line I-I' of FIG. 1. FIG. 4 is an enlarged view of A of FIG. 3. FIG. 5 is an enlarged view of B of FIG. 3.

Referring to FIGS. 3, 4, and 5, the first and second pixel electrodes PE1 and PE2 may be disposed on the transistor layer TL.

The pixel defining layer PDL may be disposed on the transistor layer TL. In an embodiment, the pixel defining layer PDL may include or be formed of an organic material. In an embodiment, for example, the organic material of the pixel defining layer PDL may include at least one selected from photoresists, polyacrylic resins, polyimide resins, acrylic resins, and the like. These may be used alone or in combination with each other. Accordingly, the pixel defining layer PDL may have a substantially flat top surface. In an embodiment, an opening exposing each of the first and second pixel electrodes PE1 and PE2 may be defined or formed in the pixel defining layer PDL.

The first separator SP1, the second separator SP2, and the third separator SP3 may be disposed on the pixel defining layer PDL. In an embodiment, the first to third separators SP1, SP2, and SP3 may be formed together during a same process.

In an embodiment, the first to third separators SP1, SP2, and SP3 may include or be formed of an organic material. In an embodiment, for example, the organic material of the first to third separators SP1, SP2, and SP3 may include at least one selected from photoresists, polyacrylic resins, polyimide resins, acrylic resins, and the like. These may be used alone or in combination with each other. In an alternative embodiment, the first to third separators SP1, SP2, and SP3 may include or be formed of a metal, an alloy, a metal oxide, a reflective conductive material, or the like.

In a cross-section, each of the first to third separators SP1, SP2, and SP3 may have an inverted trapezoidal shape. In an embodiment, for example, a length L2 of the upper portion of the first separator SP1 may be greater than a length L1 of the lower portion of the first separator SP1. Accordingly, both sides of the first separator SP1 may have a predetermined degree DG with respect to the pixel defining layer PDL. In an embodiment, for example, the predetermined degree DG may be greater than about 100 degrees. In such an embodiment, an obtuse angle of an interior angle of the inverted trapezoidal shape of the first separator SP1 may be greater than about 100 degrees.

The first light emitting part EP1 may be disposed in an opening exposing the first pixel electrode PE1. As shown in FIG. 4, the first common layer CL1 may be disposed on the first pixel electrode PE1. The first blue auxiliary layer 110B and the first blue light emitting layer 100B may be disposed on the first common layer CL1. The second common layer CL2 may be disposed on the first blue light emitting layer 100B. The second blue auxiliary layer 310B and the second blue light emitting layer 300B may be disposed on the second common layer CL2. The third common layer CL3 may be disposed on the second blue light emitting layer 300B. The common electrode 500 may be disposed on the third common layer CL3.

Referring back to FIG. 3, as described above, each of the first common layer CL1, the second common layer CL2, and the third common layer CL3 may be deposited using an open mask. Accordingly, each of the first common layer CL1, the second common layer CL2, and the third common layer CL3 may be provided formed on an entire surface of the display device 1000. Accordingly, a common piece CL' may be formed on the first separator SP1 and the second separator SP2. In such an embodiment, the common layer CL formed on the first separator SP1 and the second separator SP2 may be defined as the common piece CL'. The common layer CL may be cut off by the first separator SP1 and the second separator SP2.

Here, the common layer CL may mean at least one selected from the first common layer CL1, the second common layer CL2, and the third common layer CL3. The common piece CL' may mean at least one selected from a first common piece CL1', a second common piece CL2', and a third common piece CL3'.

In an embodiment, as shown in FIG. 5, the first common piece CL1' may be formed together with the first common layer CL1.

The second common piece CL2' may be formed together with the second common layer CL2. The second common piece CL2' may include a first piece 211, a second piece 221, a third piece 231, and a fourth piece 241. The first piece 211 may be formed together with the first electron transport layer 210, the second piece 221 may be formed together with the first charge generation layer 220, the third piece 231 may be formed together with the second charge generation layer 230, and the fourth piece 241 may be formed together with the second hole transport layer 240.

The third common piece CL3' may be formed together with the third common layer CL3.

A common electrode piece 501 may be formed together with the common electrode 500.

A capping piece 601 may be formed together with the capping layer 600.

Referring back to FIG. 3, an encapsulation layer ENC may be disposed on the first light emitting part EP1, the second light emitting part EP2, the first separator SP1, and the second separator SP2. The encapsulation layer ENC may cover the first light emitting part EP1, the second light emitting part EP2, the first separator SP1, and the second separator SP2.

Figure 6:
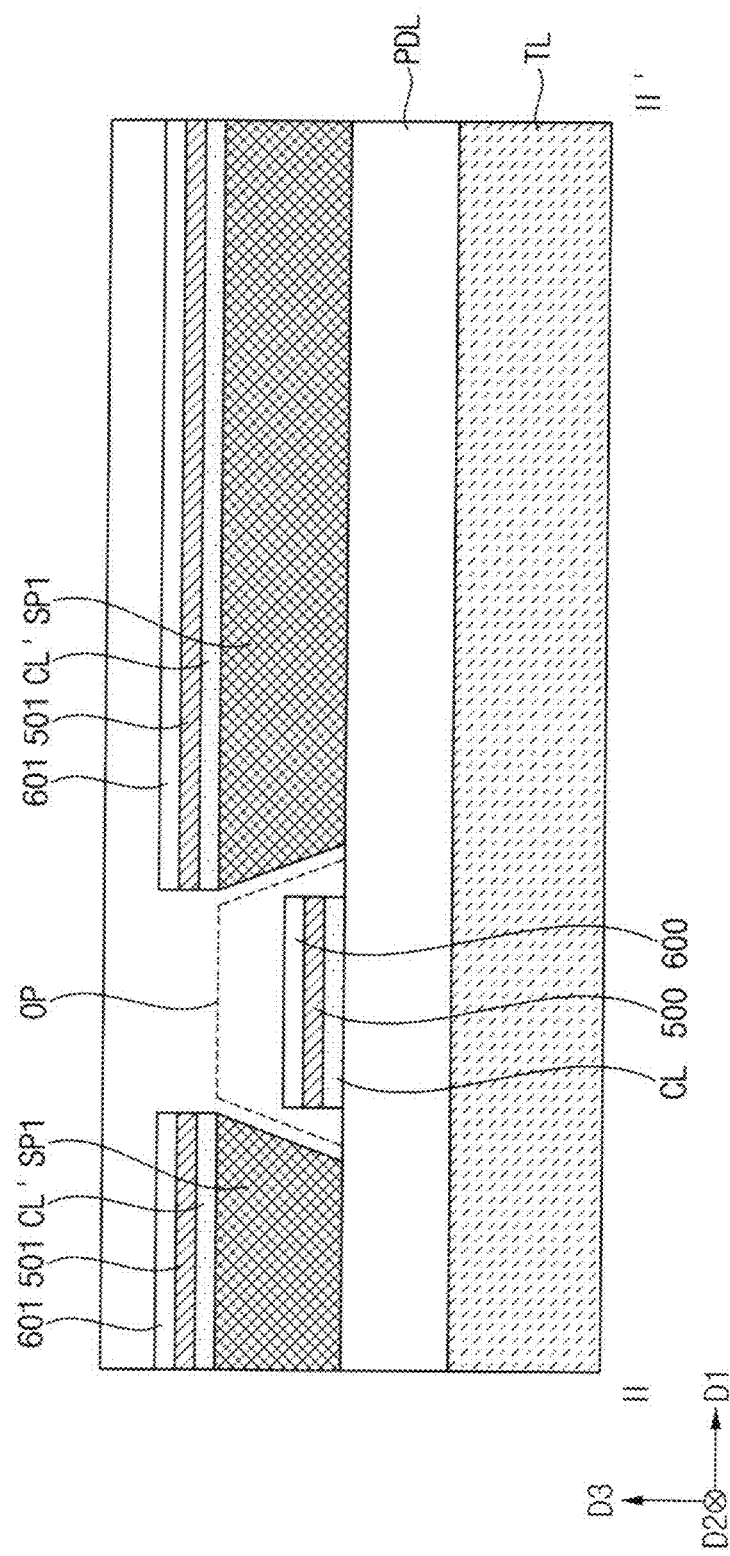
FIG. 6 is a cross-sectional view taken along line II-II' of FIG. 1.

FIG. 6 is a cross-sectional view taken along line II-II' of FIG. 1.

Referring to FIGS. 1 and 6, an open portion may be defined in each of the first to third separators SP1, SP2, and SP3. In an embodiment, for example, an open portion OP may be defined in the first separator SP1. The first separator SP1 may not be formed in the open portion OP. In a plan view, the open portion OP may serve as a passage for connecting the common layers included in the adjacent light emitting parts, in a closed curve shape including the first separator SP1.

The common layer CL may be electrically connected to the common layer CL of an adjacent light emitting part through the common layer CL disposed in the open portion OP. In an embodiment, for example, the first common layer CL1 included in the first light emitting part EP1 may be electrically connected to the first common layer CL1 included in the second light emitting part EP2, through the common layer CL1 disposed in the open portion OP. Accordingly, the common layer CL disposed on the open portion OP may serve as a line.

Figure 7:
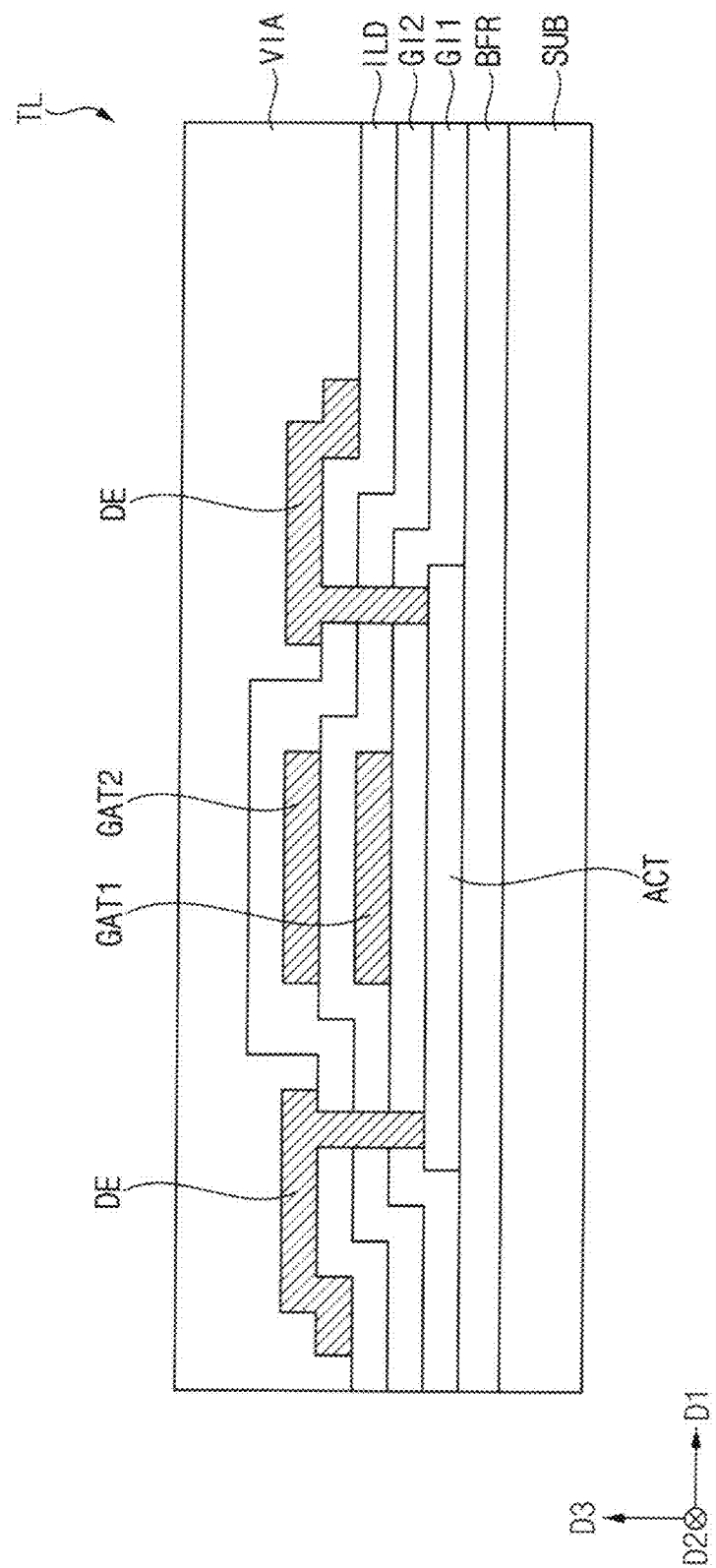
FIG. 7 is a cross-sectional view illustrating a transistor layer included in the display device of FIG. 1.

FIG. 7 is a cross-sectional view illustrating a transistor layer included in the display device of FIG. 1.

Referring to FIG. 7, the transistor layer TL may include a substrate SUB, a buffer layer BFR, an active pattern ACT, a first gate insulating layer GIL a first gate electrode GAT1, a second gate insulating layer GI2, a second gate electrode GAT2, an interlayer insulating layer ILD, a source electrode SE, a drain electrode DE, and a via insulating layer VIA.

In an embodiment, the substrate SUB may include or be formed of glass, quartz, plastic, or the like. In an embodiment, the plastic of the substrate SUB may include at least one selected from polyimide ("PI"), polyacrylate, polymethylmethacrylate ("PMMA"), polycarbonate ("PC"), polyethylenenaphthalate ("PEN"), polyvinylidene chloride, polyvinylidene difluoride ("PVDF"), polystyrene, ethylene vinylalcohol copolymer, polyethersulphone ("PES"), polyetherimide ("PEI"), polyphenylene sulfide ("PPS"), polyallylate, tri-acetyl cellulose ("TAC"), cellulose acetate propionate ("CAP"), and so on. These may be used alone or in combination with each other.

The buffer layer BFR may be disposed on the substrate SUB. In an embodiment, the buffer layer BFR may include or be formed of an inorganic material. In an embodiment, for example, the inorganic material may include at least one selected from silicon oxide, silicon nitride, silicon oxynitride, and the like. These may be used alone or in combination with each other. The buffer layer BFR may prevent metal atoms or impurities from penetrating into the active pattern ACT. In addition, the buffer layer BFR may control a heat supply rate during a crystallization process for forming the active pattern ACT.

The active pattern ACT may be disposed on the buffer layer BFR. In an embodiment, the active pattern ACT may include or be formed of a silicon semiconductor material or an oxide semiconductor material. In an embodiment, for example, the silicon semiconductor material of the active pattern ACT may include at least one selected from amorphous silicon, polycrystalline silicon, or the like. In an embodiment, for example, the oxide semiconductor material of the active pattern ACT may include at least one selected from InGaZnO ("IGZO"), InSnZnO ("ITZO"), and the like. In addition, the oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), zinc (Zn), or the like. These may be used alone or in combination with each other.

The first gate insulating layer GI1 may be disposed on the buffer layer BFR and may cover the active pattern ACT. In an embodiment, the first gate insulating layer GI1 may include or be formed of an insulating material. In an embodiment, for example, the insulating material of the first gate insulating layer GI1 may include at least one selected from silicon oxide, silicon nitride, silicon oxynitride, and the like. These may be used alone or in combination with each other.

The first gate electrode GAT1 may be disposed on the first gate insulating layer GI1. In an embodiment, the first gate electrode GAT1 may include or be formed of a metal, an alloy, a conductive metal oxide, a transparent conductive material, or the like. In an embodiment, for example, the first gate electrode GAT1 may include at least one selected from silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, and the like. These may be used alone or in combination with each other.

The second gate insulating layer GI2 may be disposed on the first gate insulating layer GI1 and may cover the first gate electrode GAT1. In an embodiment, the second gate insulating layer GI2 may include or be formed of an insulating material.

The second gate electrode GAT2 may be disposed on the second gate insulating layer GI2. In an embodiment, the second gate electrode GAT2 may include or be formed of a metal, an alloy, a conductive metal oxide, a transparent conductive material, or the like.

The interlayer insulating layer ILD may be disposed on the second gate insulating layer GI2 and may cover the second gate electrode GAT2. In an embodiment, the interlayer insulating layer ILD may include or be formed of an insulating material.

The source electrode SE and the drain electrode DE may be disposed on the interlayer insulating layer ILD. In an embodiment, the source electrode SE and the drain electrode DE may contact the active pattern ACT. The source electrode SE and the drain electrode DE may include or be formed of a metal, an alloy, a conductive metal oxide, a transparent conductive material, or the like.

The via insulating layer VIA may be disposed on the interlayer insulating layer ILD and may cover the source electrode SE and the drain electrode DE. In an embodiment, the via insulating layer VIA may include or be formed of an organic material. In an embodiment, for example, the organic material of the via insulating layer VIA may include at least one selected from photoresists, polyacrylic resins, polyimide resins, acrylic resins, and the like. These may be used alone or in combination with each other. Accordingly, the via insulating layer VIA may have a substantially flat upper surface.

The display device 1000 may include the first light emitting part EP1 and the first separator SP1. The first separator SP1 may be positioned to surround the first light emitting part EP1 on a plane or when viewed from a plan view in the third direction D3. Accordingly, the first separator SP1 may cut off adjacent light emitting parts from each other. In an embodiment, for example, the first separator SP1 may cut off between the first light emitting part EP1 and the second light emitting part EP2 so that the current applied to the first light emitting part EP1 from leaking to the second light emitting part EP2.

Figure 8:
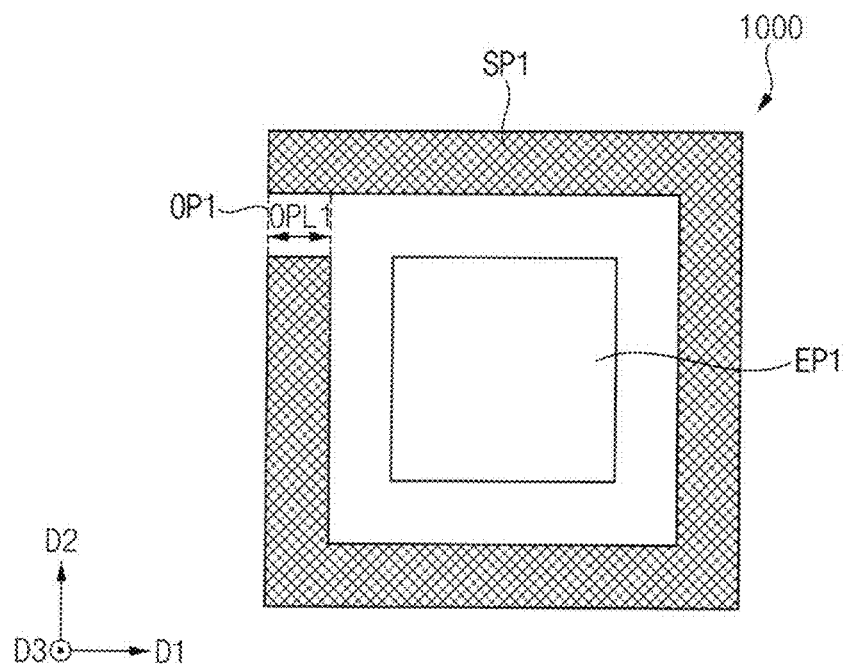
FIG. 8 is an enlarged view illustrating a separator included in the display device of FIG. 1.

FIG. 8 is an enlarged view illustrating a separator included in the display device of FIG. 1.

Referring to FIG. 8, in an embodiment, the first separator SP1 included in the display device 1000 may be positioned to surround the first light emitting part EP1 along the shape of the first light emitting part EP1. The first light emitting part EP1 may have a quadrangular shape on a plane. The first separator SP1 may be positioned to surround the first light emitting part EP1 in a spiral shape on a plane.

In an embodiment, as shown in FIG. 8, the first separator SP1 may include single membranes (or walls) adjacent to four sides of the first light emitting part EP1.

In an embodiment, a first open portion OP1 may be defined in the first separator SP1. The first separator SP1 may not be formed in the first open portion OP1. In a plan view, the first open portion OP1 may serve as a passage for connecting the common layers included in adjacent light emitting parts, in a closed curved shape including the first separator SP1. The common layer CL, the common electrode 500, and the capping layer 600 described with reference to FIG. 6 may be disposed in the first open portion OP1.

In an embodiment, the first open portion OP1 may have a first open length OPL1. In such an embodiment, the common layer CL disposed on the first open portion OP1 may have the first open length OPL1.

Figure 9:
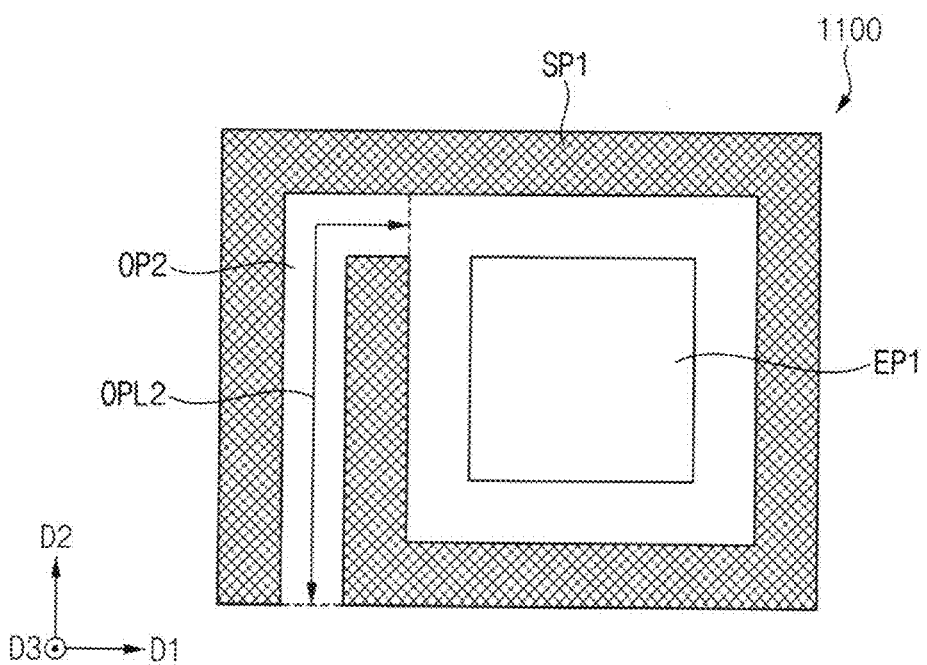
FIG. 9 is an enlarged view illustrating a separator included in a display device according to an alternative embodiment.

FIG. 9 is an enlarged view illustrating a separator included in a display device according to an alternative embodiment.

Referring to FIG. 9, an embodiment of a display device 1100 may include a first light emitting part EP1 and a first separator SP1. The first light emitting part EP1 may be substantially the same as the first light emitting part EP1 described with reference to FIG. 8.

In an embodiment, as shown in FIG. 9, the first separator SP1 may include single membranes adjacent to three sides of the first light emitting part EP1. In addition, the first separator SP1 may include a double membrane adjacent to one side.

In an embodiment, a second open portion OP2 may be defined in the first separator SP1. The first separator SP1 may not be formed in the second open portion OP2. In a plan view, the second open portion OP2 may serve as a passage for connecting common layers included in adjacent light emitting parts, in a closed curved shape including the first separator SP1. The common layer CL, the common electrode 500, and the capping layer 600 described with reference to FIG. 6 may be disposed in the second open portion OP2.

In an embodiment, the second open portion OP2 may have a second open length OPL2. In such an embodiment, the common layer CL disposed on the second open portion OP2 may have the second open length OPL2.

Figure 10:
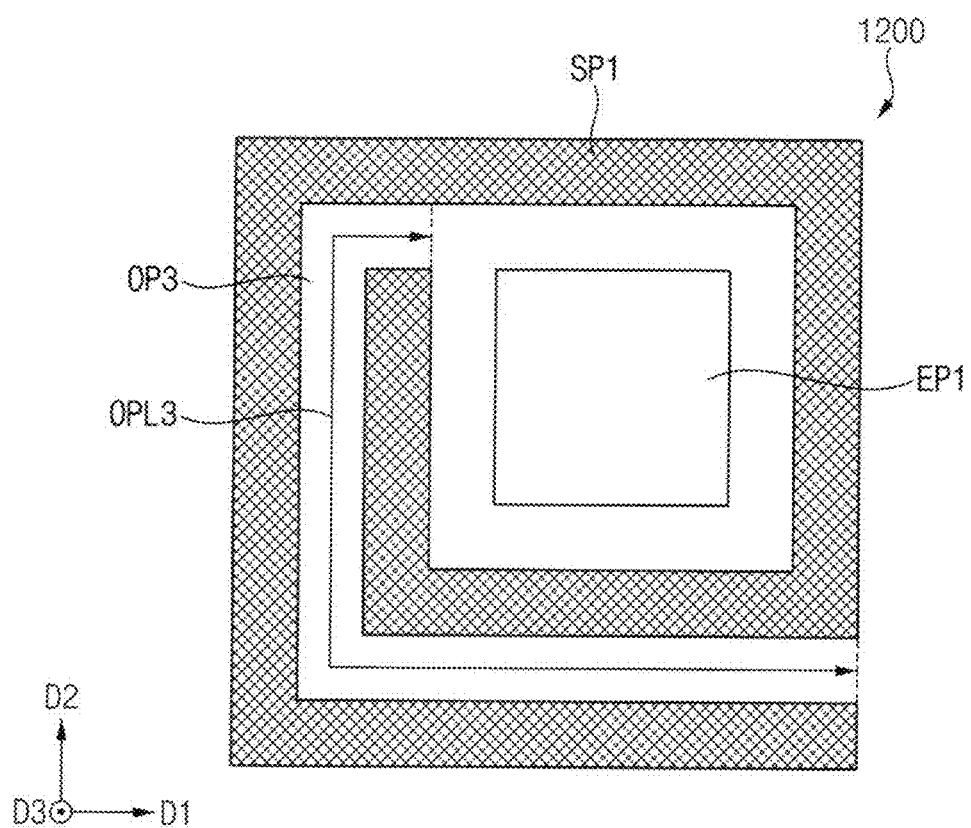
FIG. 10 is an enlarged view illustrating a separator included in a display device according to another alternative embodiment.

FIG. 10 is an enlarged view illustrating a separator included in a display device according to another alternative embodiment.

Referring to FIG. 10, an embodiment of a display device 1200 may include a first light emitting part EP1 and a first separator SP1. The first light emitting part EP1 may be substantially the same as the first light emitting part EP1 described with reference to FIG. 8.

In such an embodiment, as shown in FIG. 10, the first separator SP1 may include single membranes adjacent to two sides of the first light emitting part EP1. In such an embodiment, the first separator SP1 may include a double membrane adjacent to two sides.

In an embodiment, a third open portion OP3 may be defined in the first separator SP1. The first separator SP1 may not be formed in the third open portion OP3. In a plan view, the third open portion OP3 may serve as a passage for connecting common layers included in adjacent light emitting parts, in a closed curve shape including the first separator SP1. The common layer CL, the common electrode 500, and the capping layer 600 described with reference to FIG. 6 may be disposed in the third open portion OP3.

In an embodiment, the third open portion OP3 may have a third open length OPL3. In such an embodiment, the common layer CL disposed on the third open portion OP3 may have the third open length OPL3.

Referring to FIGS. 8, 9, and 10, the first to third open lengths OPL1, OPL2, and OPL3 may be set differently according to the shape of the first separator SP1. Accordingly, the lengths of the common layers respectively disposed in the first to third open lengths OPL1, OPL2, and OPL3 may be set differently. Therefore, an electrical resistance of each of the common layers disposed in the first to third open portions OP1, OP2, and OP3 may be set as needed.

Figure 11:
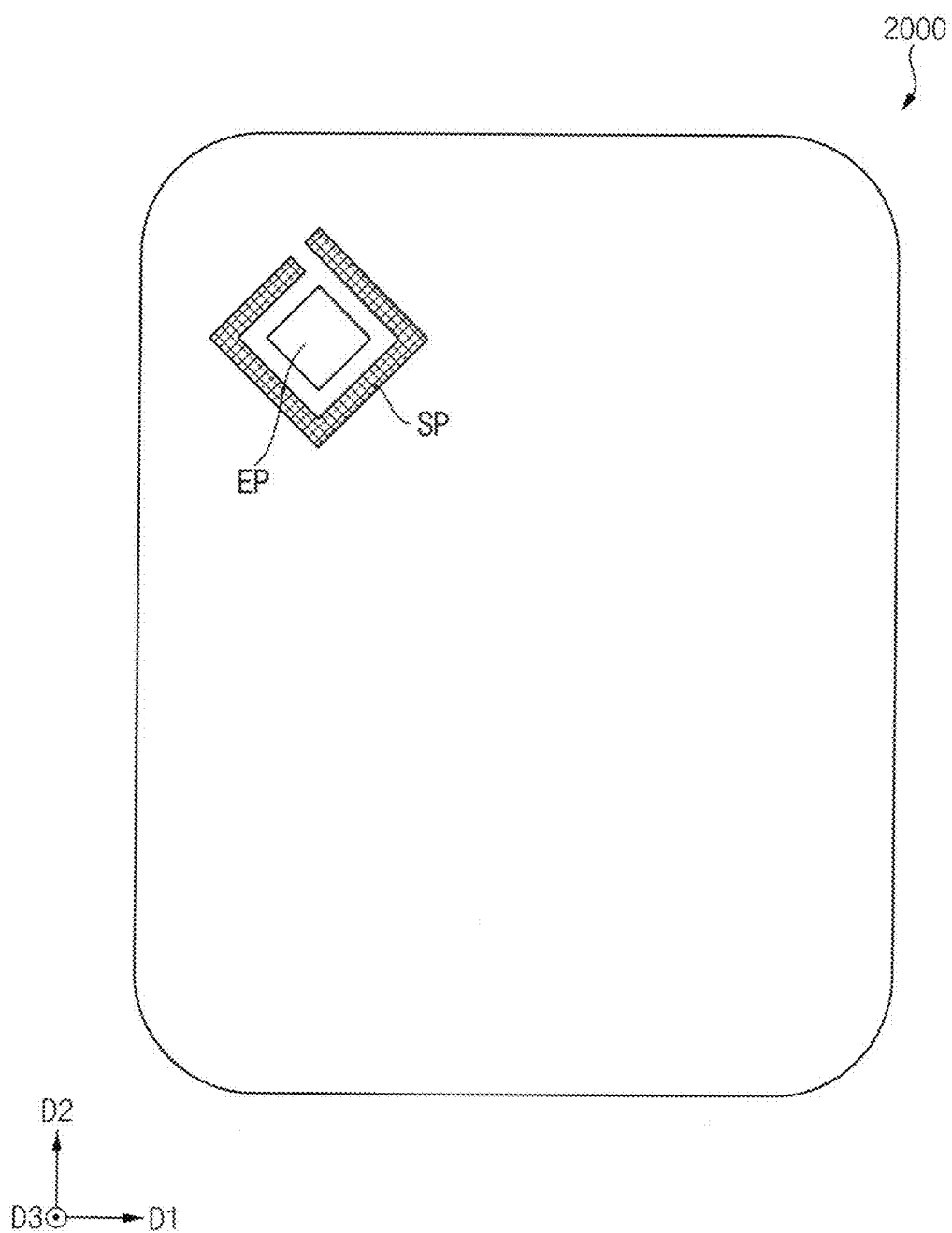
FIG. 11 is a plan view illustrating a display device according to another alternative embodiment.

FIG. 11 is a plan view illustrating a display device according to another alternative embodiment.

Referring to FIG. 11, an embodiment of a display device 2000 may include a light emitting part EP and a separator SP. In such an embodiment, the display device 2000 may be substantially the same as the display device 1000 described with reference to FIG. 1, except for a shape of the light emitting part EP and a shape of the separator SP.

In an embodiment, the light emitting part EP may have a rhombus shape on a plane. In addition, the separator SP may be positioned to surround the light emitting part EP along the shape of the light emitting part EP. The separator SP may be positioned to surround the light emitting part EP in a spiral shape on a plane.

In addition, although the separator SP including single membranes is shown in FIG. 11, the invention is not limited thereto. In an alternative embodiment, for example, the separator SP may include a double membrane on at least one side.

Figure 12:
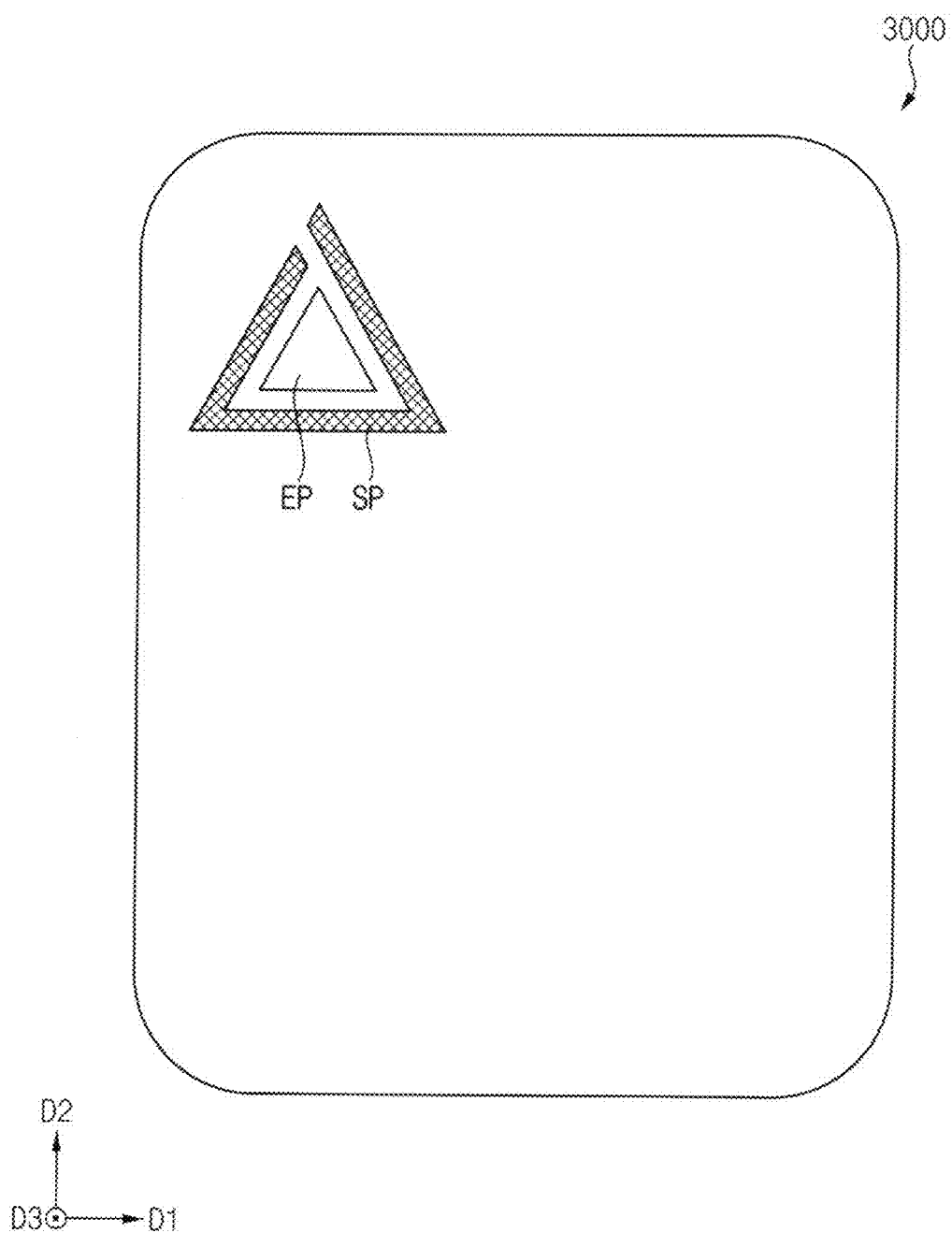
FIG. 12 is a plan view illustrating a display device according to another alternative embodiment.

FIG. 12 is a plan view illustrating a display device according to another alternative embodiment.

Referring to FIG. 12, an embodiment of a display device 3000 may include a light emitting part EP and a separator SP. In such an embodiment, the display device 3000 may be substantially the same as the display device 1000 described with reference to FIG. 1, except for a shape of the light emitting part EP and a shape of the separator SP.

In an embodiment, the light emitting part EP may have a triangular shape on a plane. In addition, the separator SP may be positioned to surround the light emitting part EP along the shape of the light emitting part EP. The separator SP may be positioned to surround the light emitting part EP in a spiral shape on a plane.

In addition, although the separator SP including single membranes is shown in FIG. 12, the invention is not limited thereto. In an alternative embodiment, for example, the separator SP may include a double membrane on at least one side.

Figure 13:
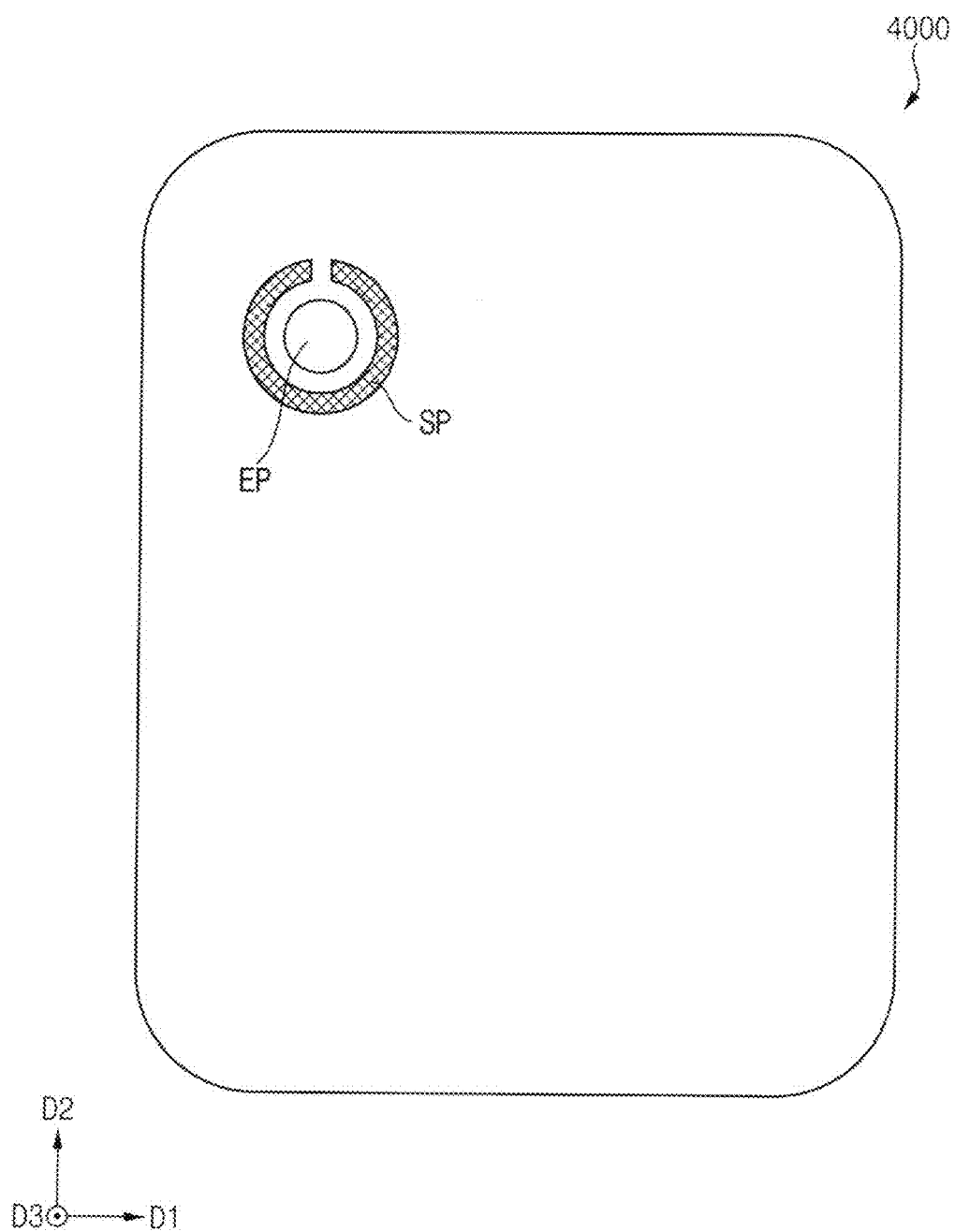
FIG. 13 is a plan view illustrating a display device according to another alternative embodiment.

FIG. 13 is a plan view illustrating a display device according to another alternative embodiment.

Referring to FIG. 13, an embodiment of a display device 4000 may include a light emitting part EP and a separator SP. In such an embodiment, the display device 4000 may be substantially the same as the display device 1000 described with reference to FIG. 1, except for a shape of the light emitting part EP and a shape of the separator SP.

In an embodiment, the light emitting part EP may have a circular shape on a plane. In addition, the separator SP may be positioned to surround the light emitting part EP along the shape of the light emitting part EP. The separator SP may be positioned to surround the light emitting part EP in a spiral shape on a plane.

In addition, although the separator SP including single membranes is shown in FIG. 13, the invention is not limited thereto. In an alternative embodiment, for example, the separator SP may include a double membrane on at least a predetermined region.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
   a light emitting part disposed on a substrate, wherein the light emitting part includes a portion of a common layer; and
   a separator disposed on the substrate to surround the light emitting part on a plane, wherein a length of an upper portion of the separator is greater than a length of a lower portion of the separator in a cross-section, and an open portion is defined in the separator,
   wherein a portion of the separator disposed at one side of the light emitting part on the plane has a double wall structure, and the open portion is defined between the double wall structure in a curved shape on the plane.

2. The display device of claim 1, wherein the separator is positioned to surround the light emitting part along a shape of the light emitting part on the plane.

3. The display device of claim 2,
   wherein the light emitting part has a quadrangular shape on the plane, and
   wherein the separator is positioned to surround the light emitting part in a spiral shape on the plane.

4. The display device of claim 2,
   wherein the light emitting part has a rhombus shape on the plane, and
   wherein the separator is positioned to surround the light emitting part in a spiral shape on the plane.

5. The display device of claim 2,
wherein the light emitting part has a triangular shape on the plane, and
wherein the separator is positioned to surround the light emitting part in a spiral shape on the plane.

6. The display device of claim 2,
wherein the light emitting part has a circular shape on the plane, and
wherein the separator is positioned to surround the light emitting part in a spiral shape on the plane.

7. The display device of claim 1,
wherein another portion of the common layer is disposed on the separator, and
wherein the portion of the common layer is cut off from the another portion of the common layer by the separator.

8. The display device of claim 1, wherein the separator includes an organic material.

9. The display device of claim 1, wherein the separator includes a metal material.

10. The display device of claim 1,
wherein the separator has an inverted trapezoidal shape in the cross-section, and
wherein an obtuse angle of the inverted trapezoidal shape is greater than 100 degrees.

11. The display device of claim 1, further comprising:
an encapsulation layer disposed on the light emitting part and the separator to cover the light emitting part and the separator.

12. The display device of claim 1, wherein the light emitting part includes:
a first light emitting layer which emits light of a predetermined color; and
a second light emitting layer disposed on the first light emitting layer, wherein the second light emitting layer emits light of a same color as the predetermined color of the first light emitting layer.

13. The display device of claim 12, wherein the common layer includes a first common layer disposed under the first light emitting layer.

14. The display device of claim 13, wherein the first common layer includes a first hole transport layer.

15. The display device of claim 13, wherein the common layer further includes a second common layer disposed between the first light emitting layer and the second light emitting layer.

16. The display device of claim 15, wherein the second common layer includes a charge generation layer.

17. The display device of claim 16, wherein the second common layer further includes:
a first electron transport layer disposed under the charge generation layer; and
a second hole transport layer disposed on the charge generation layer.

18. The display device of claim 15, wherein the common layer further includes a third common layer disposed on the second light emitting layer.

19. The display device of claim 18, wherein the third common layer includes a second electron transport layer.

* * * * *